United States Patent
Yoo

(10) Patent No.: US 8,687,423 B2
(45) Date of Patent: Apr. 1, 2014

(54) NONVOLATILE MEMORY DEVICE AND METHOD OF OPERATING THE SAME

(75) Inventor: Byoung Sung Yoo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 13/541,254

(22) Filed: Jul. 3, 2012

(65) Prior Publication Data

US 2013/0070535 A1    Mar. 21, 2013

(30) Foreign Application Priority Data

Sep. 21, 2011    (KR) .......................... 10-2011-0095084

(51) Int. Cl.
*G11C 16/04*    (2006.01)

(52) U.S. Cl.
USPC ............ 365/185.12; 365/185.21; 365/185.22; 365/185.18

(58) Field of Classification Search
USPC ............ 365/185.12, 185.21, 185.22, 185.18, 365/185.19, 189.05
See application file for complete search history.

(56) References Cited

U.S. PATENT DOCUMENTS 8,385,120 B2 * 2/2013 Jang et al. ................ 365/185.12

* cited by examiner

*Primary Examiner* — David Lam
(74) *Attorney, Agent, or Firm* — IP & T Group LLP

(57) ABSTRACT

A nonvolatile memory device includes a control logic configured to generate an internal command in response to an internal clock, a finite state machine configured to generate a plurality of current state signals in a program pulse and verify pulse setup operation for a program operation and a program verify operation in response to the internal command, after a program operation using a program pulse and a program verify operation using a program verify pulse are completed, and a glue logic configured to generate check control signals for checking a plurality of page buffers of the page buffer unit in response to the plurality of current state signals in the setup operation.

22 Claims, 4 Drawing Sheets

NONVOLATILE MEMORY DEVICE AND METHOD OF OPERATING THE SAME

CROSS-REFERENCE TO RELATED APPLICATION

Priority to Korean patent application number 10-2011-0095084 filed on Sep. 21, 2011, the entire disclosure of which is incorporated by reference herein, is claimed.

BACKGROUND

Embodiments of the present invention relate to a nonvolatile memory device and a method of operating the same and, more particularly, to a nonvolatile memory device capable of reducing the operating time and a method of operating the same.

A nonvolatile memory device enables data to be electrically programmed and erased and does not use a refresh function of rewriting the data in a specific cycle.

In general, the nonvolatile memory device is programmed through an incremental step pulse program (ISPP) method.

The ISPP method is described below.

After supplying a program pulse to the memory cells of the nonvolatile memory device, a program verification operation is performed in order to check whether the threshold voltages of the memory cells have been programmed higher than a target threshold voltage or not. If, as a result of the program verification operation, the threshold voltage of any of the memory cells is lower than the target threshold voltage, the program pulse raised by a step voltage is supplied to the memory cells and the program verification operation is performed again. That is, the above operation is repeatedly performed until the memory cells reach the target threshold voltage or higher.

In general, after an operation of supplying one program pulse and a program verification operation are completed, a control logic within a microcontroller for controlling the program operation performs an operation of newly setting up pieces of option information, such as a voltage of a new program pulse, the number of times that the program pulse is supplied, and a pass voltage supplied to an unselected word line. After the setup operation is completed, the control logic performs a page buffer check operation of determining whether a page buffer is normal or not.

In this case, the total time that the nonvolatile memory device performs the program operation may increase because the control logic separately performs the setup operation and the page buffer check operation.

BRIEF SUMMARY

Exemplary embodiments relate to a nonvolatile memory device and a method of operating the same, which are capable of reducing the operating time by simultaneously performing a setup operation and a page buffer check operation subsequent to a program verification operation.

A nonvolatile memory device according to an aspect of the present invention includes a memory cell array comprising a plurality of memory cells; a page buffer unit configured to program a program data into the plurality of memory cells in a program operation and verify data programmed into the plurality of memory cells in a program verification operation; a control logic configured to generate an internal command in response to an internal clock; a finite state machine configured to generate a plurality of current state signals in a program pulse and verify pulse setup operation for a program operation and a program verify operation in response to the internal command, after a program operation using a program pulse and a program verify operation using a program verify pulse are completed; and a glue logic configured to generate check control signals for checking a plurality of page buffers of the page buffer unit in response to the plurality of current state signals in the setup operation.

A nonvolatile memory device according to another aspect of the present invention includes a memory cell array comprising a plurality of memory cells; a page buffer unit configured to store data to be programmed into the plurality of memory cells in a program operation and verify data programmed into of the plurality of memory cells in a program verification operation; a voltage supply circuit configured to supply a program pulse and a program verification pulse for the respective program and program verification operations to a word line of the memory cell array; and a microcontroller configured to generate check control signals for checking the page buffer unit while the program pulse and the program verification pulse are set up after the program operation and the program verification operation are completed.

A method of operating a nonvolatile memory device according to yet another aspect of the present invention includes supplying a program pulse to a word line of a memory cell array in a program operation; supplying a program verification pulse to the word line of the memory cell array to verify the program operation by using a page buffer coupled to a bit line of the memory cell array in a program verification operation; finishing a program operation, if the program operation is determined to be a pass in the program verification operation; and checking the page buffer while setting up the program pulse and the program verification pulse, if the program operation is determined to be a fail in the program verification operation.

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to the exemplary embodiments of the present invention.

Figure 1:
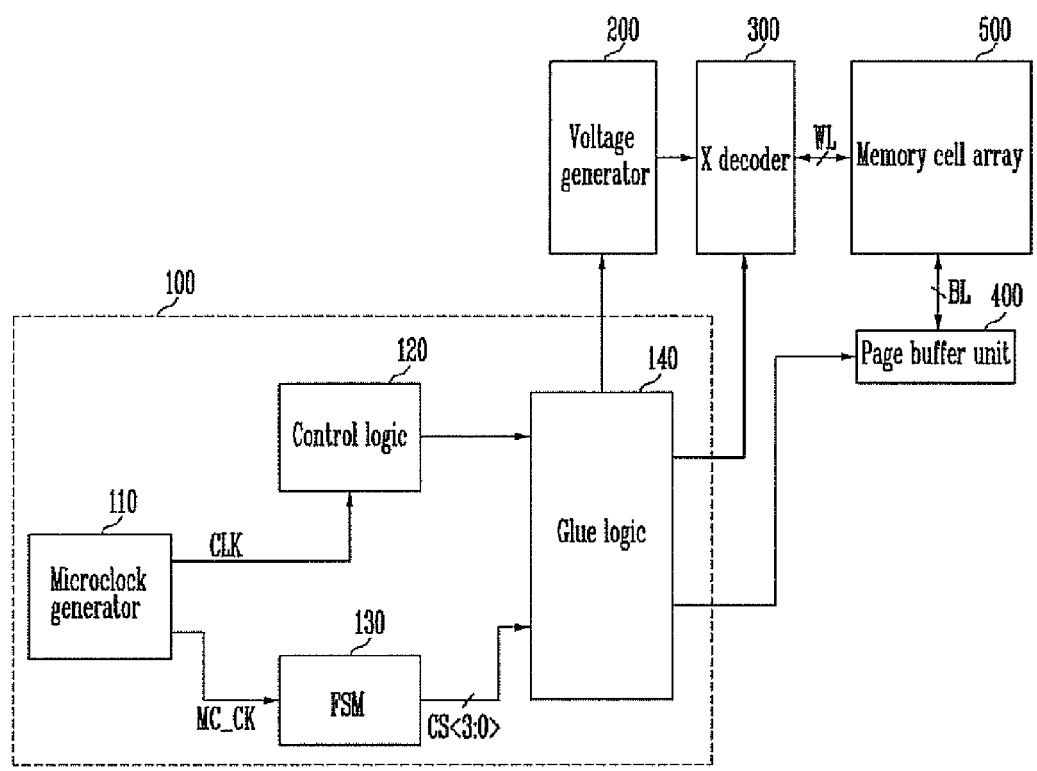
FIG. 1 is a block diagram illustrating a nonvolatile memory device according to an exemplary embodiment of the present invention.

FIG. 1 is a block diagram illustrating a nonvolatile memory device according to an exemplary embodiment of the present invention.

Referring to FIG. 1, the nonvolatile memory device includes a microcontroller 100, a voltage generator 200, an X decoder 300, a page buffer unit 400, and a memory cell array 500.

The microcontroller 100 includes a microclock generator 110, a control logic 120, a finite state machine (hereinafter referred to as an 'FSM') 30, and a glue logic 140.

The microclock generator 110 outputs an internal clock CLK having a specific cycle to the control logic 120 and outputs a microclock MC_CK, generated by reducing the cycle of the internal clock CLK, to the FSM 130.

The control logic 120 stores an algorithm for executing the program operation, program verification operation, read operation, and erase operation of the nonvolatile memory device and pieces of option information, such as a voltage of a new program pulse, the number of times that the program pulse is supplied, and a pass voltage supplied to an unselected word line. The control logic 120 generates internal control signals for the program, program verification, read, and erase operations in synchronization with the internal clock CLK. Furthermore, the control logic 120 performs a setup operation in order to update the pieces of option information, such as a voltage of a new program pulse, the number of times that the program pulse is supplied, and a pass voltage supplied to an unselected word line.

The FSM 130 generates a plurality of current state signals CS<3:0>, the logic values of which sequentially increase, in the setup operation of the control logic 120 in response to the microclock MC_CK.

The glue logic 140 generates a microcontrol signal for controlling the voltage generator 200, the X decoder 300, and the page buffer unit 400 in response to a plurality of internal control signals generated from the control logic 120. Furthermore, the glue logic 140 generates a plurality of check control signals (for example, TRANC, TRANM, and TRANF) for the page buffer check operation of the page buffer unit 400 in response to the plurality of current state signals CS<3:0> in the setup operation of the control logic 120.

The voltage generator 200 generates a program voltage and a program verification voltage which will be supplied to the memory cell array 500 in a program operation and a program verification operation.

The X decoder 600 supplies the program voltage and the program verification voltage of the voltage generator 200 to a word line selected from the word lines of the memory cell array 100.

The page buffer unit 400 includes a plurality of page buffers coupled to a plurality of bit lines BL included in the memory cell array 500. Each of the plurality of page buffers stores program data to be programmed into a memory cell coupled thereto through the bit line BL or generates verification data by sensing data stored in a memory cell coupled thereto in a program verification operation. Furthermore, in a page buffer check operation, the page buffer unit 400 generates a check signal by determining whether each of the page buffers operates properly or not in response to the check control signals TRANC, TRANM, and TRANF generated from the glue logic 140.

The memory cell array 500 includes a plurality of memory cells for storing data, and the memory cells are coupled to word lines and the bit lines BL.

Figure 2:
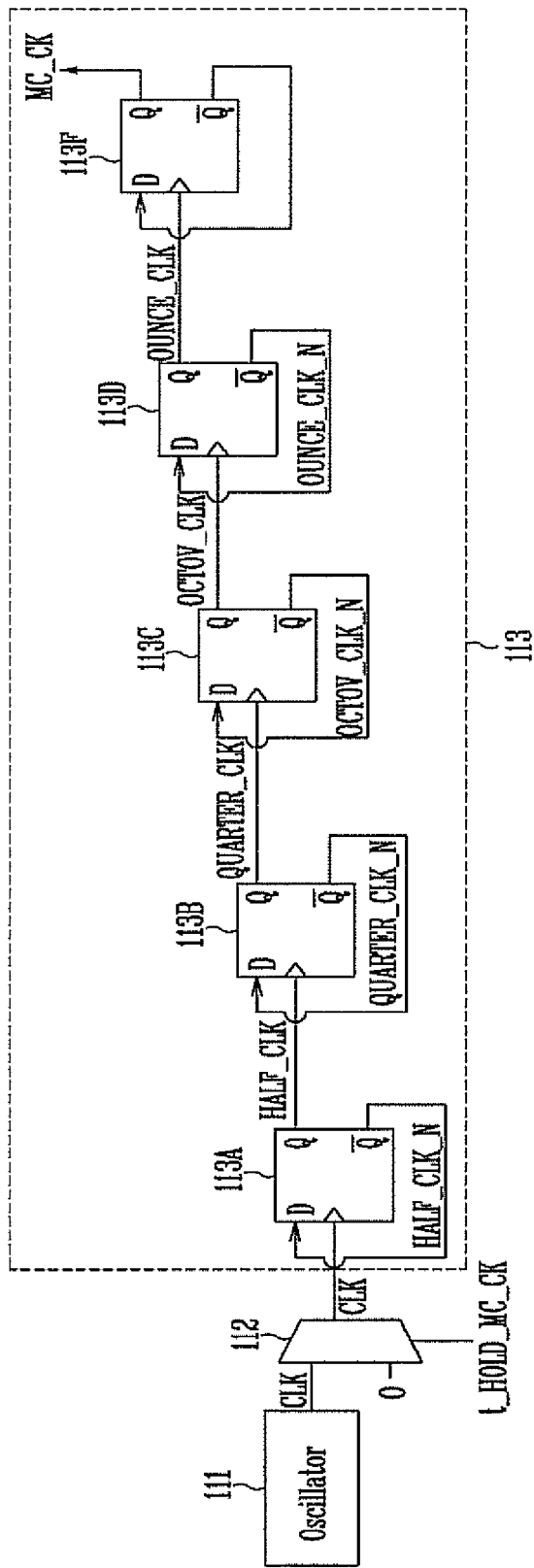
FIG. 2 is a circuit diagram of a microclock generator shown in FIG. 1.

FIG. 2 is a circuit diagram of the microclock generator 110 shown in FIG. 1.

Referring to FIG. 2, the microclock generator 110 includes an oscillator 111, a multiplexer 112, and a T flip-flop unit 113.

The oscillator 111 generates the internal clock CLK having a specific cycle.

The multiplexer 112 selectively outputs an internal clock CLK or a signal of logic '0' in response to a holding signal t_HOLD_MC_CK. For example, when the holding signal t_HOLD_MC_CK is activated, the multiplexer 112 may select and output the internal clock CLK. The holding signal t_HOLD_MC_CK is enabled in the setup operation of the control logic 120 shown in FIG. 1.

The T flip-flop unit 113 includes a plurality of T flip-flops 113A, 113B, 113C, 113D, and 113F that are coupled in series. Each of the T flip-flops 113A, 113B, 113C, 113D, and 113F reduces a cycle of an input clock by half and generates an output clock the cycle of which is half the cycle of the input clock. For example, the T flip-flop 113A generates a first clock HALF_CLK by reducing a cycle of the internal clock CLK by half in response to the internal clock CLK of the multiplexer 112. The T flip-flop 113B generates a second clock QUARTER_CLK by reducing the cycle of the first clock HALF_CLK by half in response to the first clock HALF_CLK of the T flip-flop 113A. The T flip-flop 113C generates a third clock OCTOV_CLK by reducing the cycle of the second clock QUARTER_CLK by half in response to the second clock QUARTER_CLK of the T flip-flop 113B. The T flip-flop 113D generates a fourth clock OUNCE_CLK by reducing the cycle of the third clock OCTOV_CLK by half in response to third clock OCTOV_CLK of the T flip-flop 113C. Finally, the T flip-flop 113F generates the microclock MC_CLK by reducing the cycle of the fourth clock OUNCE_CLK by half in response to the fourth clock OUNCE_CLK of the T flip-flops 113D. The number of T flip-flops included in the T flip-flop unit 113 may be changed in order to generate the microclock MC_CLK having a desired clock cycle.

Figure 3:
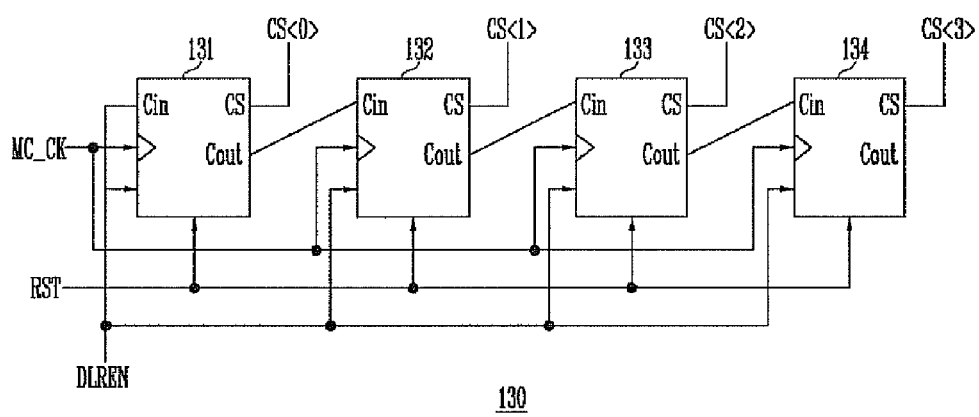
FIG. 3 is a circuit diagram of a finite state machine (FSM) shown in FIG. 1.

FIG. 3 is a circuit diagram of the FSM 130 shown in FIG. 1.

Referring to FIG. 3, the FSM 130 includes a plurality of control units 131 to 134.

In an exemplary embodiment of the present invention, the four control units 131 to 134 are illustrated in order to implement an operation of 4 bits, but the number of control units may be changed in order to implement an extended operation.

The plurality of control units 131 to 134 are reset in response to a reset signal RST. The plurality of control units 131 to 134 are enabled in response to an enable signal DLREN. Furthermore, the control unit 131 receives the enable signal DLREN as an input signal Cin in an initial operation. Each of the control units 132 to 134 receives a carry-out signal Cout, outputted from the preceding control unit, as the input signal Cin. Furthermore, the control units 131 to 134 generate the first to fourth current state signals CS<0:3>, respectively, by synchronizing the respective input signals Cin with the microclock MC_CK.

Accordingly, the plurality of control units 131 to 134 generate the first to fourth current state signals CS<0:3> in response to the one microclock MC_CK.

Figure 4:
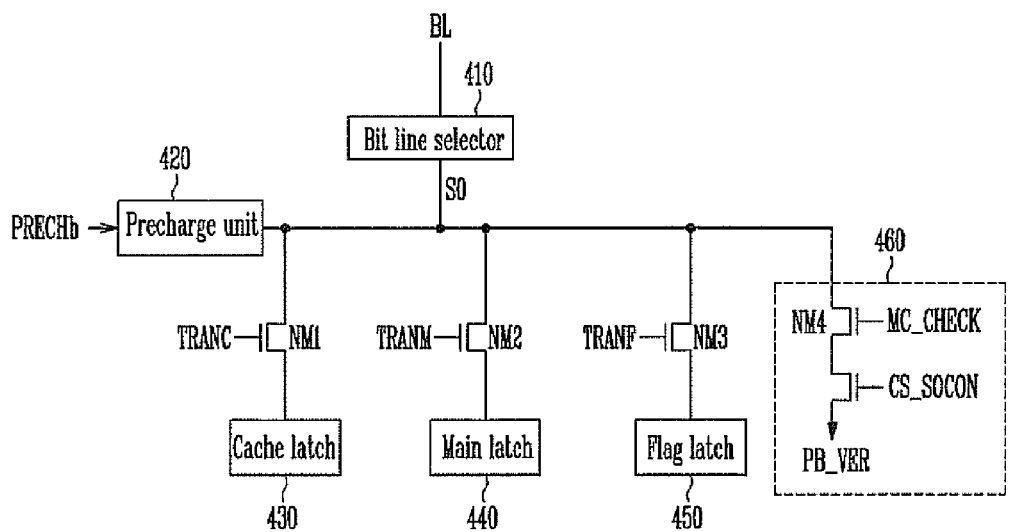
FIG. 4 is a circuit diagram of one of page buffers included in a page buffer unit shown in FIG. 1.

FIG. 4 is a circuit diagram of one of the page buffers included in the page buffer unit shown in FIG. 1.

Referring to FIG. 4, the page buffer includes a bit line selector 410 for controlling connection between the bit line BL coupled to the memory cell array 500 and the sense node SO of the page buffer, a precharge unit 420 for precharging the sense node SO to a power supply voltage, latches (i.e., a cache latch 430, a main latch 440, and a flag latch 450) for temporarily storing data and maintaining or discharging the potential of the sense node SO depending on the stored data, and a verification unit 460 for generating a page buffer verification signal PB_VER based on the potential of the sense node SO in a page buffer check operation.

The cache latch 430, the main latch 440, and the flag latch 450 are connected to or disconnected from the sense node SO through a transfer gate NM1, a transfer gate NM2, and a transfer gate NM2, respectively.

Figure 5:
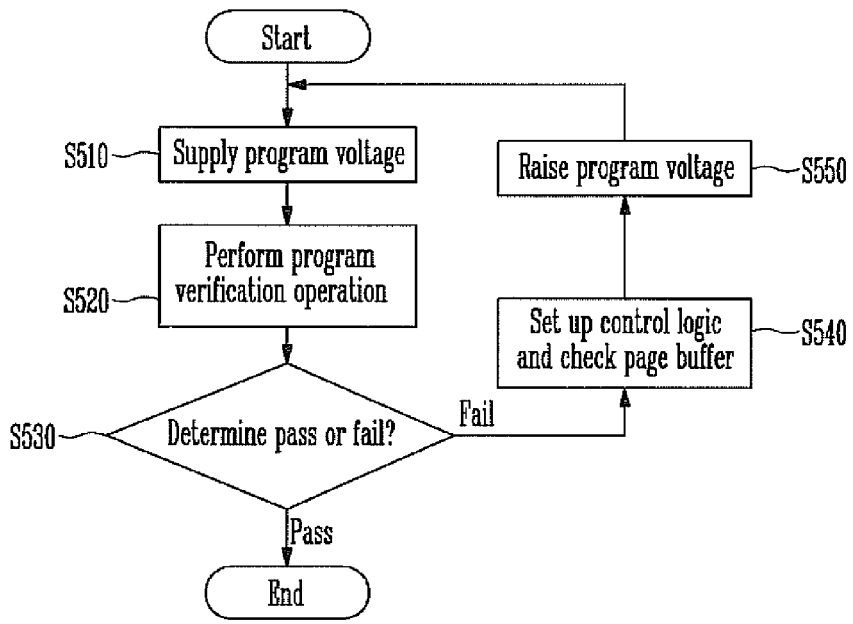
FIG. 5 is a flowchart illustrating the operation of the nonvolatile memory device of FIG. 1.

FIG. 5 is a flowchart illustrating the operation of the non-volatile memory device of FIG. 1.

Figure 6:
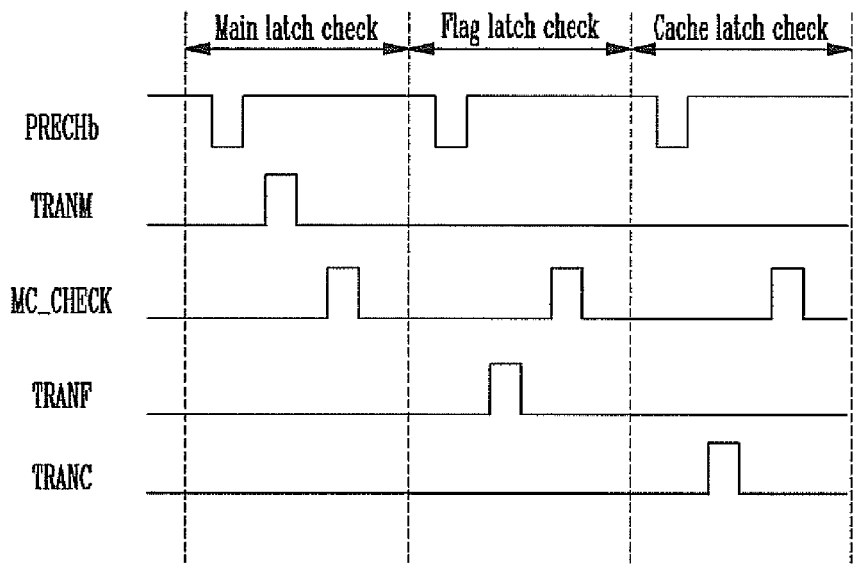
FIG. 6 is a waveform illustrating a plurality of check control signals outputted from a microcontroller in a page buffer check operation.

FIG. 6 is a waveform illustrating the plurality of check control signals generated from the microcontroller 100 in the page buffer check operation.

A method of operating the non-volatile memory device according to an exemplary embodiment of the present invention is described below with reference to FIGS. 1 to 6.

1) Supply Program Voltage (S510)

The control logic 120 of the microcontroller 100 generates internal control signals for a program operation in synchronization with the internal clock CLK of the microclock generator 110. The glue logic 140 of the microcontroller 100 generates the control signals for controlling the voltage generator 200, the X decoder 300 and the page buffer unit 400 in response to the internal control signals of the control logic 120. The voltage generator 200 generates a program voltage, and the X decoder 300 supplies the program voltage to a selected word line WL of the memory cell array 500. At this time, the page buffer unit 400 controls the potential of each of the plurality of bit lines BL based on program data.

2) Perform Program Verification Operation (S520)

The control logic 120 of the microcontroller 100 generates internal control signals for a program verification operation in synchronization with the internal clock CLK of the microclock generator 110. The glue logic 140 of the microcontroller 100 generates the control signals for controlling the voltage generator 200, the X decoder 300, and the page buffer unit 400 in response to the internal control signals of the control logic 120. The voltage generator 200 generates a program verification voltage, and the X decoder 300 supplies the program verification voltage to the selected word line WL of the memory cell array 500. At this time, the page buffer unit 400 performs the program verification operation by sensing the potential of each of the plurality of bit lines BL.

3) Determine Pass or Fail (S530)

Whether the program operation is a pass or fail is determined in response to the page buffer verification signal PB_VER outputted from the page buffer in the program verification operation.

The operation of supplying the program voltage (S510), the program verification operation (S520), and the operation of determining a pass or fail (S530) are defined as one program cycle in the program operation using an incremental step pulse program (ISPP) method.

4) Perform Setup Operation and Page Buffer Check Operation (S540)

If, as a result of the program verification operation, the program operation is determined to be a pass at step S530, the program operation is finished. If, as a result of the program verification operation, the program operation is determined to be a fail, the control logic 120 performs a setup operation. The setup operation of the control logic 120 is performed in order to update pieces of option information, such as a voltage of a new program pulse, the number of times that the program pulse is supplied, and a pass voltage supplied to an unselected word line.

During the setup operation of the control logic 120, the page buffer unit 400 performs a page buffer check operation.

The page buffer check operation is described in detail below.

The oscillator 111 of the microclock generator 110 generates the internal clock CLK having a specific cycle. The multiplexer 112 outputs the internal clock CLK to the T flip-flop unit 113 in response to the holding signal t_HOLD_MC_CK which is enabled in the setup operation of the control logic 120. The T flip-flop unit 113 generates the microclock MC_CK by reducing the cycle of the internal clock CLK.

The FSM 130 generates the plurality of current state signals CS<3:0> in response to the microclock MC_CK.

The glue logic 140 generates the control signals for the page buffer check operation in response to the plurality of current state signals CS<3:0> generated from the FSM 130.

Table 1 shows logic values of the control signals which are generated from the glue logic 140 in response to the plurality of current state signals CS<3:0> generated from the FSM 130.

TABLE 1

| CS <3:0> | TRANM | CS_SOCN | MC_CHECK | TRANF | TRANC |
|---|---|---|---|---|---|
| 0000 | 0 | 0 | 0 | 0 | 0 |
| 0001 | 1 | 0 | 0 | 0 | 0 |
| 0010 | 0 | 0 | 0 | 0 | 0 |
| 0011 | 0 | 1 | 0 | 0 | 0 |
| 0100 | 0 | 1 | 1 | 0 | 0 |
| 0101 | 0 | 1 | 0 | 0 | 0 |
| 0110 | 0 | 1 | 0 | 1 | 0 |
| 0111 | 0 | 1 | 0 | 0 | 0 |
| 1000 | 0 | 1 | 1 | 0 | 0 |
| 1001 | 0 | 1 | 0 | 0 | 0 |
| 1010 | 0 | 1 | 0 | 0 | 1 |
| 1011 | 0 | 1 | 0 | 0 | 0 |
| 1100 | 0 | 1 | 1 | 0 | 0 |
| 1101 | 0 | 1 | 0 | 0 | 0 |

Referring to Table 1 and FIG. 6, the control signals have different logic values as the logic values of the current state signals are sequentially changed from 0000 to 1101. This is described below.

The sense node SO of the page buffer is precharged to a power supply voltage level through the precharge unit 420.

The sense node SO and the main latch 440 are coupled in response to a main latch transfer signal TRANM of a high level that is generated from the glue logic 140. At this time, since the main latch 440 is in a reset state, the potential of the sense node SO maintains the power supply voltage level. If an initialization operation is not properly performed or a leakage path occurs within a circuit, the potential of the sense node SO is discharged to a low voltage level. The sense node sense signal CS_SOCON of a high level is inputted in the page buffer check operation. Furthermore, in response to a page buffer check signal MC_CHECK of a high level, the page buffer verification signal PB_VER is generated depending on the potential of the sense node SO. Likewise, the cache latch 430 and the flag latch 450 are coupled to the sense node SO, and the page buffer check operation is performed in response to the page buffer verification signal PB_VER generated depending on the potential of the sense node SO.

During the page buffer check operation, whether the page buffer operates properly or not is determined. If, as a result of the determination, the page buffer is determined not to operate properly, it is preferred that the program operation be finished.

5) Raise Program Voltage (S550)

After the setup operation of the control logic and the page buffer check operation are finished, the program voltage is raised by a step voltage. Next, a next program cycle is performed again starting from step S510 where the program voltage is supplied.

As described above, in accordance with the exemplary embodiments, the operating time may be reduced because the page buffer unit performs the page buffer check operation while the control logic performs the setup operation.

Accordingly, the nonvolatile memory device and the method of operating the same in accordance with the exemplary embodiments are capable of reducing the operating time of the nonvolatile memory device because the setup operation of the control logic of the microcontroller and the page buffer check operation of the page buffer unit are performed at the same time subsequent to a program verification operation.

What is claimed is:

1. A nonvolatile memory device, comprising:
a memory cell array comprising a plurality of memory cells;
a page buffer unit configured to program a program data into the plurality of memory cells in a program operation and verify data programmed into the plurality of memory cells in a program verification operation;
a control logic configured to generate an internal command in response to an internal clock;
a finite state machine configured to generate a plurality of current state signals in a program pulse and verify pulse setup operation for a program operation and a program verify operation in response to the internal command, after a program operation using a program pulse and a program verify operation using a program verify pulse are completed; and
a glue logic configured to generate check control signals for checking a plurality of page buffers of the page buffer unit in response to the plurality of current state signals in the setup operation.

2. The nonvolatile memory device of claim 1, wherein the glue logic is configured to generate control signals for enabling the page buffer unit to store the program data in the program operation and store the programmed data by sensing the plurality of memory cells in the program verification operation, in response to the internal command.

3. The nonvolatile memory device of claim 1, further comprising a microclock generator configured to generate the internal clock and a microclock.

4. The nonvolatile memory device of claim 3, wherein the microclock generator comprises:
an oscillator configured to generate the internal clock;
a multiplexer configured to output one of the internal clock and a signal of a logic low level in response to a holding signal activated in the setup operation; and
a T flip-flop unit configured to generate the microclock by reducing a cycle of the internal clock.

5. The nonvolatile memory device of claim 4, wherein the T flip-flop unit comprises a plurality of T flip-flops coupled in series, and each of the plurality of T flip-flops is configured to generate an output clock by reducing a cycle of an input clock.

6. The nonvolatile memory device of claim 4, wherein the multiplexer is configured to output the internal clock in the setup operation and output the signal of the logic low level in remaining operations other than the setup operation.

7. The nonvolatile memory device of claim 1, wherein a logic value of the plurality of current state signals sequentially increases in the setup operation.

8. The nonvolatile memory device of claim 1, wherein the finite state machine comprises a plurality of control units coupled in series and is configured to generate the respective current state signals.

9. The nonvolatile memory device of claim 1, wherein each of the plurality of page buffers comprises:
a bit line selector configured to control connection between a bit line of the memory cell array and a sense node;
a precharge unit configured to precharge the sense node to a power supply voltage level;
a plurality of latches coupled to the sense node through respective transfer gates in response to the check control signals; and
a verification unit configured to generate a page buffer verification signal by sensing a potential of the sense node in response to the check control signals.

10. The nonvolatile memory device of claim wherein in the setup operation, the control logic is configured to update pieces of option information including a voltage of a new program pulse, a number of times that the program pulse is supplied, and a pass voltage supplied to a unselected word line.

11. A nonvolatile memory device, comprising:
a memory cell array comprising a plurality of memory cells;
a page buffer unit configured to store data to be programmed into the plurality of memory cells in a program operation and verify data programmed into the plurality of memory cells in a program verification operation;
a voltage supply circuit configured to supply a program pulse and a program verification pulse for the respective program and program verification operations to a word line of the memory cell array; and
a microcontroller configured to generate check control signals for checking the page buffer unit while the program pulse and the program verification pulse are set up after the program operation and the program verification operation are completed.

12. The nonvolatile memory device of claim 11, wherein the microcontroller comprises:
a microclock generator configured to generate an internal clock and a microclock;
a control logic configured to generate internal control signals for controlling the program operation and the program verification operation in response to the internal clock;
a finite state machine configured to generate a plurality of current state signals for performing the check operation of the page buffer unit in response to the microclock; and
a glue logic configured to generate micro control signals for controlling the page buffer unit and the voltage supply circuit in response to the internal control signals and generate the check control signals in response to the plurality of current state signals.

13. The nonvolatile memory device of claim 12, wherein the microclock generator comprises:
an oscillator configured to generate the internal clock;
a multiplexer configured to output one of the internal clock and a signal of a logic low level in response to a holding signal activated when the program pulse and the program verification pulse are set up; and
a T flip-flop unit configured to generate the microclock by reducing a cycle of the internal clock.

14. The nonvolatile memory device of claim 13, wherein the T flip-flop unit comprises a plurality of T flip-flops coupled in series, and each of the plurality of T flip-flops is configured to generate an output clock by reducing a cycle of an input clock.

15. The nonvolatile memory device of claim 13, wherein the multiplexer is configured to output the internal clock when the program pulse and the program verification pulse are set up and output the signal of the logic low level in remaining operation sections.

16. The nonvolatile memory device of claim 12, wherein the finite state machine generates the plurality of current states sequentially increasing in the setup operation of the control logic.

17. The nonvolatile memory device of claim 12, wherein the finite state machine comprises a plurality of control units for generating the respective current state signals in response to the microclock.

18. The nonvolatile memory device of claim 11, wherein the page buffer unit comprises a plurality of page buffers, and each of the plurality of page buffers comprises:
   a bit line selector configured to control connection between a bit line of the memory cell array and a sense node;
   a precharge unit configured to precharge the sense node to a power supply voltage level;
   a plurality of latches coupled to the sense node through respective transfer gates in response to the check control signals; and
   a verification unit configured to generate a page buffer verification signal by sensing a potential of the sense node in response to the check control signals.

19. The nonvolatile memory device of claim 12, wherein the voltage supply circuit comprises:
   a voltage generator configured to generate a program voltage and a verification voltage in response to one of the micro control signals; and
   an X decoder configured to supply the program voltage and the program verification voltage to the word line in response to one of the micro control signals.

20. The nonvolatile memory device of claim 11, wherein the control logic is configured to update pieces of option information including a voltage of the program pulse, a number of times that the program pulse is supplied, and a pass voltage supplied to an unselected word line, when the program pulse and the program verification pulse are set up.

21. A method of operating a nonvolatile memory device, comprising:
   supplying a program pulse to a word line of a memory cell array in a program operation;
   supplying a program verification pulse to the word line of the memory cell array to verify the program operation by using a page buffer coupled to a bit line of the memory cell array in a program verification operation;
   finishing a program operation, if the program operation is determined to be a pass in the program verification operation; and
   checking the page buffer while setting up the program pulse and the program verification pulse, if the program operation is determined to be a fail in the program verification operation.

22. The method of claim 21, further comprising:
   performing the program operation by supplying the set up program pulse to the word line of the memory cell array, if, as a result of the checking of the page buffer, the page buffer is determined to be a pass; and
   finishing the program operation if, as a result of the checking of the page buffer, the page buffer is determined to be a fail.

* * * * *